United States Patent [19]
Matsumoto et al.

[11] Patent Number: 5,801,986
[45] Date of Patent: Sep. 1, 1998

[54] SEMICONDUCTOR MEMORY DEVICE HAVING BOTH REDUNDANCY AND TEST CAPABILITY AND METHOD OF MANUFACTURING THE SAME

[75] Inventors: Osamu Matsumoto, Kawasaki; Eishirou Take, Yokohama; Tadashi Yabuta, Tokyo; Kenjiro Kanayama, Yokohama, all of Japan

[73] Assignee: Kabushiki Kaisha Toshiba, Kawasaki, Japan

[21] Appl. No.: 679,712

[22] Filed: Jul. 12, 1996

[30] Foreign Application Priority Data

Jul. 15, 1995 [JP] Japan .................................. 7-201535

[51] Int. Cl.$^6$ ................................................ G11C 16/04
[52] U.S. Cl. .................. 365/185.09; 365/201; 365/225.7
[58] Field of Search .............................. 365/185.09, 200, 365/201, 225.7, 230.06

[56] References Cited

U.S. PATENT DOCUMENTS

| | | | |
|---|---|---|---|
| 5,113,371 | 5/1992 | Hamada | 365/200 |
| 5,233,566 | 8/1993 | Imamiya et al. | 365/230.08 |
| 5,289,417 | 2/1994 | Ooishi | 365/200 |
| 5,299,164 | 3/1994 | Takeuchi | 365/201 |
| 5,345,110 | 9/1994 | Renfro et al. | 307/272.3 |
| 5,528,540 | 6/1996 | Shibata | 365/200 |

FOREIGN PATENT DOCUMENTS

| | | |
|---|---|---|
| 0 249 903 | 12/1987 | European Pat. Off. . |
| 0 528 744 | 2/1993 | European Pat. Off. . |
| 2 699 301 | 6/1994 | France . |
| 40 25-158 | 2/1991 | Germany . |

*Primary Examiner*—David C. Nelms
*Assistant Examiner*—Son Mai
*Attorney, Agent, or Firm*—Finnegan, Henderson, Farabow, Garrett & Dunner, L.L.P.

[57] ABSTRACT

A spare decoder has a first register, a second register, and a multiplexer for selecting the output of the first register or that of the second register. The first register stores data of a fuse element. In the ordinary operating mode, a defective memory cell is replaced by a spare cell in accordance with the data stored in the first register. In the test mode, it is determined whether at least one spare cell is defective or not. If there are no defective spare cells, the data that should be stored in the defective memory cell is written into one of the spare cells. Further, the address of the defective memory cell is written into the second register. The defective memory cell is replaced by one of the spare cells in accordance with the data stored in the second register, by cutting the fuse element in accordance with the address of the defective memory cell.

14 Claims, 11 Drawing Sheets

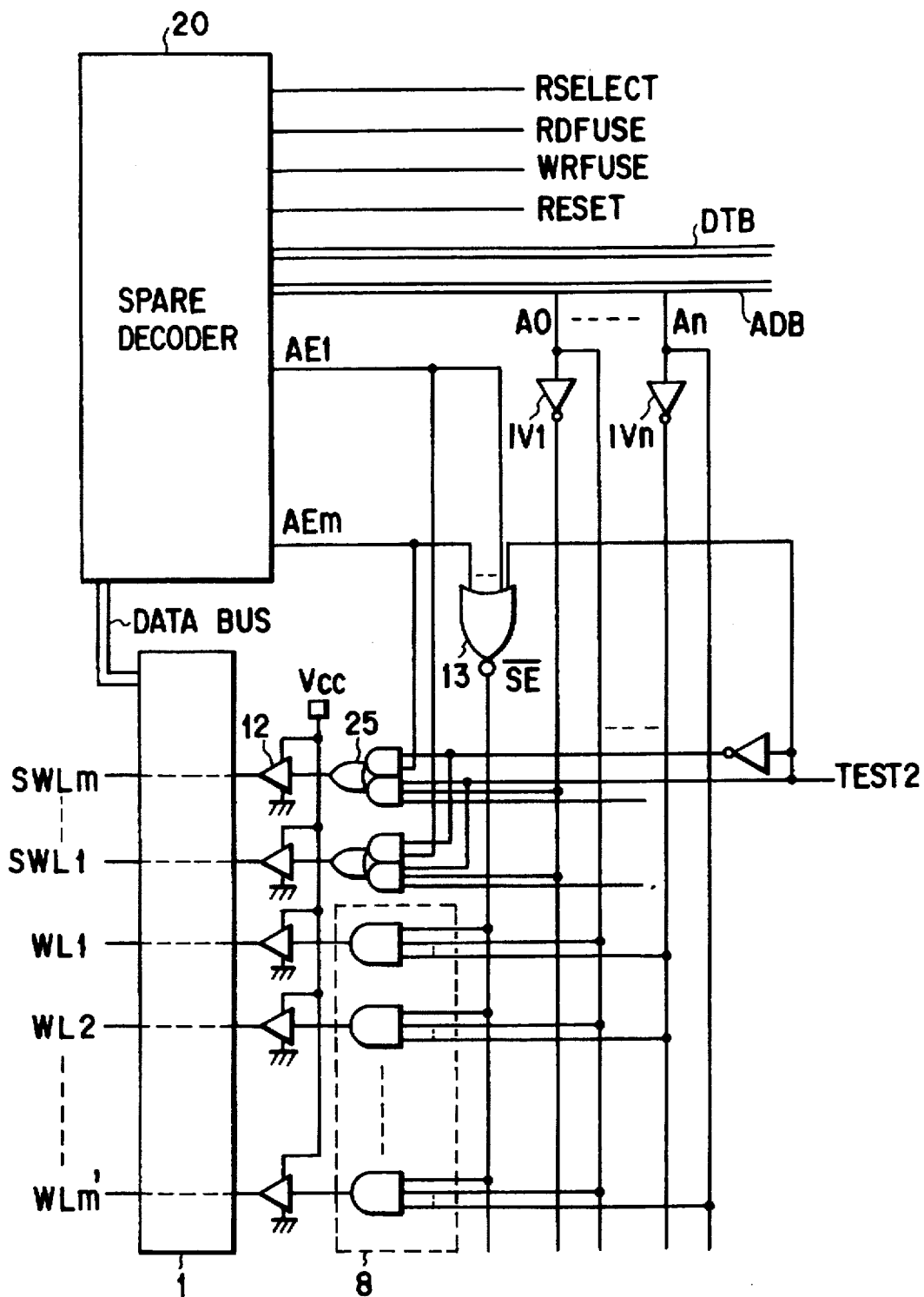
F I G. 1

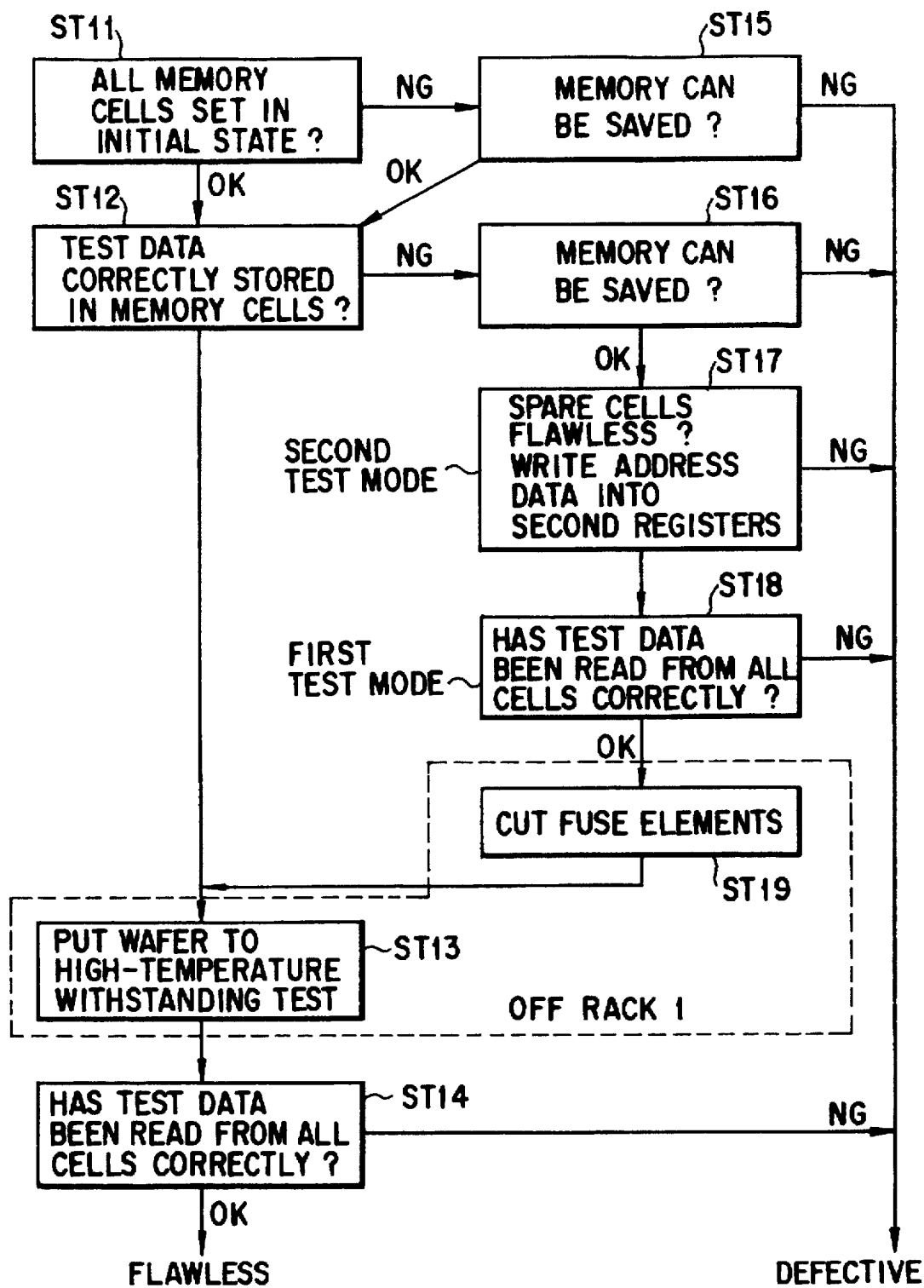
F I G. 6

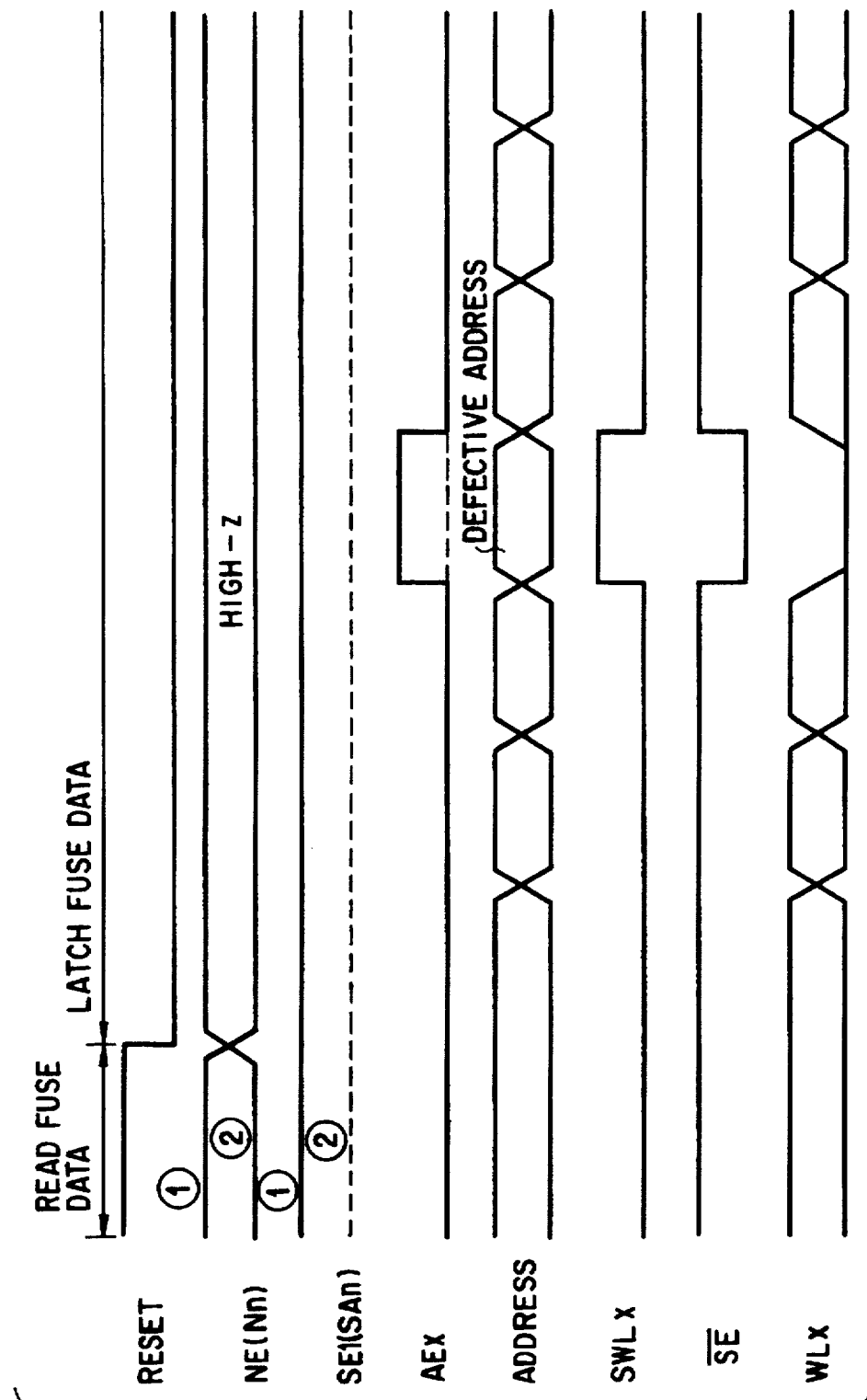
F I G. 7

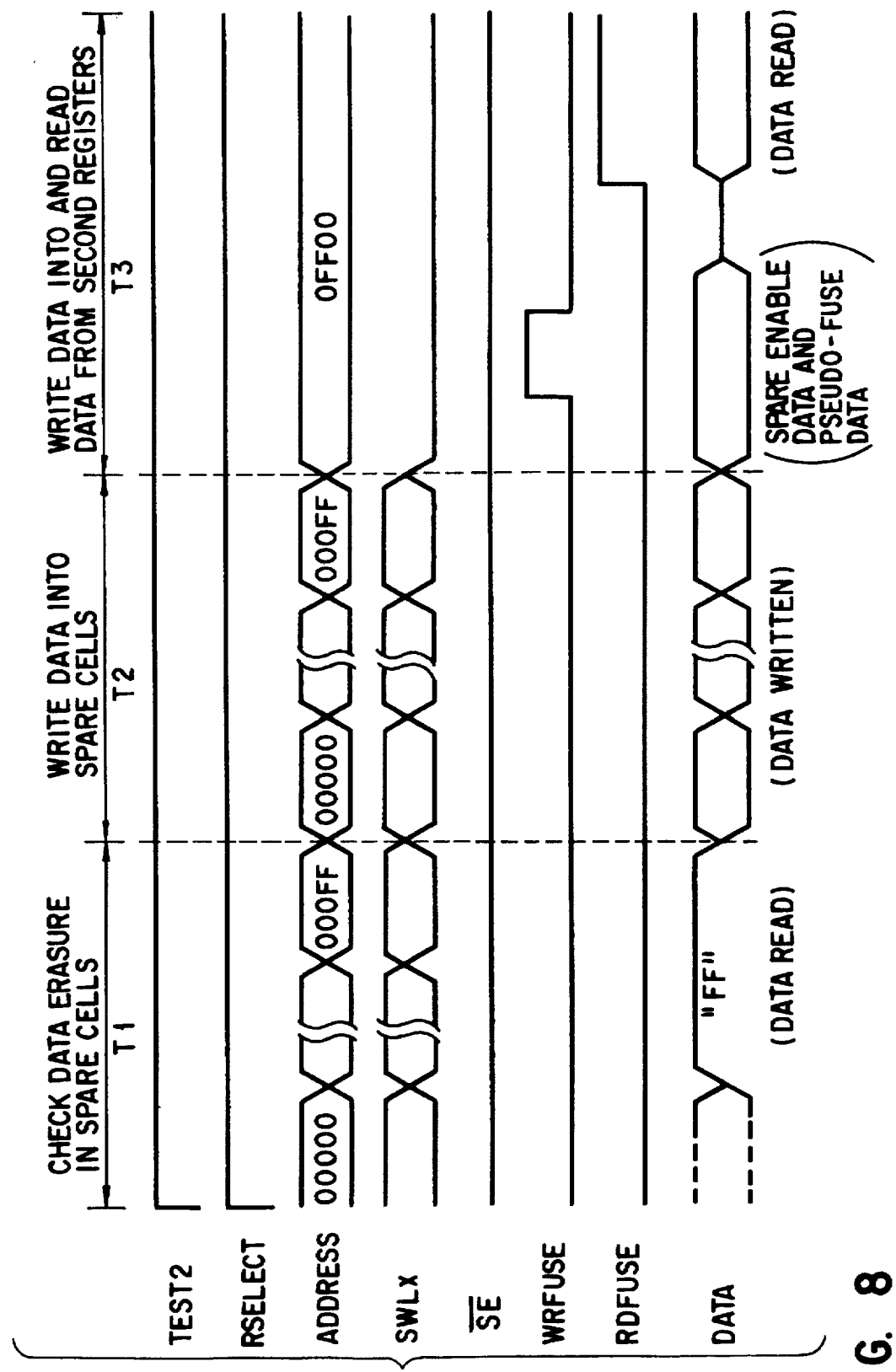
F I G. 8

SEMICONDUCTOR MEMORY DEVICE HAVING BOTH REDUNDANCY AND TEST CAPABILITY AND METHOD OF MANUFACTURING THE SAME

BACKGROUND OF THE INVENTION

1. Field of the Invention

The present invention relates to a semiconductor memory device having a redundancy circuit and, more particularly to a semiconductor memory device for use in a one-chip microcontroller and also to a method of testing this semiconductor memory device.

2. Description of the Related Art

Recently, semiconductor elements incorporated in a semiconductor substrate have been made smaller than before. More and more semiconductor elements are included in one chip. Along with the increase in the number of elements, technique of reducing defect density in semiconductor devices is gradually improved. Nevertheless, a low yield of the device comprising these elements is observed during the development of a device or at the start of mass production thereof. To increase the yield, it has been proposed and practiced to incorporate a redundancy circuit in the device.

A redundancy circuit incorporated in a semiconductor memory, for saving the memory despite of the defects made during the manufacture of the memory, will be described. The circuit comprises several rows of spare cells and several columns of spare cells. Assume the memory have defective rows of memory cell and/or defective columns of memory cells. When an address signal is input to the memory, designating any defective row or column of memory cells, a row or column of spare cells is selected, not the defective row or column. The semiconductor memory can therefore be used as a reliable one, even if it has defective rows of memory cell and/or defective columns of memory cells. Thanks to the redundancy circuit, the yield of the memory is very high though the chip area of the memory is larger than in the case where no redundancy circuit is incorporated. What is indispensable to any memory having a redundancy circuit is programming means which assigns the addresses of the defective rows and columns to the spare rows and columns.

FIGS. 12 and 13 show a semiconductor memory which has a redundancy circuit. The memory is the type in which a spare row (word) line is selected in place of a row (word) line to which at least one defective memory cell is connected. As shown in FIG. 12, the memory comprises a memory section 1, a spare decoder 10, level shifters 12, a NOR circuit 13 and a row decoder 8. The spare decoder 10 stores addresses of defective rows (hereinafter referred to as "defective addresses"). Address signals A0 to An are input to the spare decoder 10 via an address bus. If the address defined by the signals A0 to An is identical to one of the defective addresses, the spare decoder 10 generates a coincidence signal AE1, AE2, ... or AEm. The coincidence signal is input to the NOR circuit 13 and also to the corresponding spare row line SWL1, SWL1, ... or SWLm through the level shifters 12. The NOR circuit 13 generates a spare enable signal $\overline{SE}$ in accordance with the coincidence signals AE1 to AEm. The spare enable signal $\overline{SE}$ is supplied to the row decoder 8. The signal $\overline{SE}$ disables the row decoder 8 so that the spare row lines SWL1 to SWLm may be selected. When the row decoder 8 is in enabled state, it selects one of the row line WL1 to WLm' in accordance with the address signals A0 to An.

The row lines WL1 to WLm' and the spare row lines SWL1 to SWLm' are incorporated in the memory section 1.

The memory section 1 comprises k column (bit) lines extending at right angles to the row lines WL1 to WLm', m'×k memory cells (not shown) arranged in m' rows and k columns, and m×k spare cells (not shown) arranged in m rows and k columns. The gates of k memory cells forming a row are connected to one row line, and the gates of k spare cells forming a row are connected to one spare row line. The source and drain electrodes of each memory cell are connected to the ground line (not shown) and one column line, or to the column line or the ground line, respectively. So are the source and drain electrode of each spare cell. The column lines are connected to a column selector (not shown) and amplifiers (not shown). The data signals generated by the sense amplifiers are supplied to a data bus.

FIG. 13 shows the spare decoder 10. The spare decoder 10 has coincidence detecting circuits 101 to 10m and AND circuits 111 to 11m. The output signals from of each coincidence detecting circuits are supplied to one AND circuit. The coincidence detecting circuit 101 comprises fuse circuits FE1, F01, F11, ... Fn-11 and Fn1, the coincidence detecting circuit 10m comprises fuse circuits FEm, F0m, F1m, ... Fn-1m and Fnm. The fuse circuits of each coincidence detecting circuit output signals each having logic value "1" when the address signals A0 to An input to them are identical to the defective address signals stored in them. In this case, the AND circuit to which "1s" are input generates a coincidence signal.

The coincidence detecting circuits 101 to 10m are identical in structure. Therefore, only the coincidence detecting circuit 101 will be described with reference to FIG. 14. The fuse circuit FE1 stores a bit which enables the coincidence detecting circuit 101 so that the redundancy circuit can be used. The fuse circuit FE1 comprises a resistor R, a fuse element F and a buffer 81. The resistor R and the fuse element F are connected in series between the power supply and the ground. The buffer 81 has its input connected to the node N1 of the resistor R and the fuse element F. When the fuse element F is melted and cut by supplying a current through the element F or a laser beam is applied thereto, the potential of the node N1 rises to the high level ("1"). As a result, the spare enable signal SE output from the buffer 81 rises to the high level.

The remaining fuse circuits F01 to Fn1 of the coincidence detecting circuit 101 store defective address signals. Each of the fuse circuits F01 to Fn1 comprises a resistor R, a fuse element F and an exclusive OR circuit 82. The exclusive OR circuit 82 has two inputs, one of which is connected to the node of the resistor R and the fuse element F and the other of which is connected to receive a one-bit address signal. The exclusive OR circuits 82 generate of the coincidence detecting circuits 101 generate coincidence signals SA01 to SAn1. Namely, each fuse circuit stores a defective address signal in accordance with whether the fuse element F has been melted away or not. Assume that address signals A0 and A1 input to the fuse circuits F01 and F11 have logic values "0" and "1", respectively, and that the fuse elements F of these circuits F01 and F11 have been cut and not cut, respectively. Then, the fuse circuit F01 outputs a coincidence signal SA01 which has logic value "1", and the fuse circuit F11 outputs a coincidence signal SA11 which has logic value "1". That is, if-the coincidence detecting circuits 101 receives a defective address, it will generates coincidence signals SA01 to SAn1 all of which have logic value "1".

FIG. 15 is a flow chart explaining a method of testing the conventional redundancy circuit described above. The test is performed by a tester (not shown), to which the wafer on which the semiconductor memory is attached. First, it is determined whether or not all memory cells of the memory are set in the initial state, for example whether or not data has been erased from the memory cells (Step ST1). If YES in Step ST1, test data is written into the memory cells, and it is determined whether or not the memory cells store the test data correctly (Step ST2). If YES in Step ST2, the memory is found to have no defects. Hence, the redundancy circuit need not be used at all. In this case, the wafer is removed from the tester and subjected to high-temperature withstanding test in a test apparatus (Step ST3). Thereafter, the wafer is attached to the tester again, and the test data is read from the memory. It is determined whether semiconductor memory functions well or not (Step ST4). If all bits of the test data remain stored in the memory cells, the semiconductor memory is regarded as flawless. Thus, the test completes for the semiconductor memory.

If NO in Step ST1, that is, if a part of data is found stored in the memory cells, indicating that at least one memory cell is defective, the flow goes to Step ST5, in which it is determined whether or not the semiconductor memory can be saved by using the limited number of rows of spare cells (Step ST5). If NO in Step ST5, the semiconductor memory is considered defective. If YES in Step ST5, the flow returns to Step ST2, in which the test data is written into the semiconductor memory, and it is determined whether or not the memory cells store the test data correctly. If NO in Step ST2, it is determined whether or not the semiconductor memory can be saved by using the limited number of rows of spare cells (Step ST6). If NO in step ST6, the memory is regarded as defective. If YES in Step ST6, the flow goes to Step ST7, in which some of the fuse elements incorporated in the spare decoder 10 are cut.

The fuse elements F cannot be cut as long as the wafer remains attached to the tester. The wafer is removed from the tester and attached to a fuse-cutting apparatus, which is operated, cutting some of the fuse elements F incorporated in the spare decoder 10. The wafer is attached to the tester again. It is then determined whether any row of spare cells is defective or not, more precisely whether data can be correctly erased from and written into the memory cells of each row (Step ST8). If NO in Step ST8, the memory is found defective. If YES in Step ST8, it is determined whether data can be read from all memory cells correctly or not (Step ST9). If NO in Step ST9, the semiconductor memory is considered defective. If YES in Step ST9, the flow go back to Step ST3, in which the wafer is removed from the tester again and subjected to high-temperature withstanding test again. Then, the wafer is attached to the tester again, and data is read from the memory, to determine whether the semiconductor memory functions well or not (Step ST4). If YES in Step ST4, the memory is found flawless. If NO, it is regarded as defective.

As can be understood from FIG. 15, the wafer needs to be removed from the tester twice in order to use the rows of spare cells in place of the rows of memory cells which are defective. Namely, the wafer must be set in off-rack state two times. The more often the wafer is removed from the tester, the more frequently the semiconductor memory abuts on the probe of the tester, inevitably increasing the possibility of damaging the pad of the memory.

The rows of spare cells cannot be tested until after some of the fuse elements F incorporated in the redundancy circuit (more precisely in the spare decoder 10) are melted away. Hence, even if the spare cells are defective and cannot be used in place of any memory cells that are found to be defective, a long time must be spent to test the semiconductor memory.

SUMMARY OF THE INVENTION

The object of the present invention is to provide a semiconductor memory device which comprises a redundancy circuit comprising spare cells and fuse elements used as memory elements and in which the spare cells can be tested before the fuse elements are cut, and also to provide a method of testing a semiconductor memory of this type with high efficiency.

To achieve the object, according to the present invention there is provided a semiconductor memory which comprises: a memory sections having a plurality row lines, a plurality of spare row lines, a plurality of memory cells arranged in rows and connected to the row lines, and a plurality of spare cells arranged in rows and connected to the spare row lines; nonvolatile memory means storing at least one defective address representing a row line including at least one defective memory cell, and storing data for allowing at least one spare row line to replace the at least one row line; a first register for storing the data read from the nonvolatile memory means; a second register for storing defective addresses supplied from an external device and representing defective ones of the row lines and storing the data read from the nonvolatile memory means; and a selecting circuit for selecting signals output from the first register or from the second register, in accordance with a selection signal. In a first mode other than a test mode, any row line including at least one defective memory cell is replaced by one of the spare row lines in accordance with the data stored in the first register. In a second mode which is a test mode, any row line including at least one defective memory cell is replaced by one of the spare row lines in accordance with the data stored in the second register.

To achieve the above-mentioned object, according to the invention there is provided a method of testing a semiconductor memory which comprises the steps of: a first step of reading data from all memory cells, thereby to determine whether the memory cells are initialized; a second step of determining whether it is possible to write data into all memory cells, when all memory cells are found initialized; a third step of reading data from the spare cells when at least one defective memory cell is detected in the first step or the second step, determining whether the spare cells are initialized, determining whether it is possible to write data into the spare cells, and storing into a register an address data for the at least one defective memory cell and data allowing at least one spare row line to replace the at least one row line, when it is found possible to write data into the spare cells; a fourth step of replacing the at least one defective memory cell with a spare cell in accordance with the address data stored in the register, and determining whether it is possible to read data from all memory cells; and a fifth step of cutting fuse elements incorporated in a redundancy circuit in accordance with the address data for the at least one defective memory cell, when it is determined in the fourth step that it is possible to replace the at least one defective memory cell with a spare cell so as to read data from all memory cells.

Thus it is possible with the present invention to determine whether data can be written into and read from the spare cells before the fuse elements (i.e., the nonvolatile memory means) are cut. The spare cells need not be tested after the fuse elements are cut. After the fuse elements are cut, it suffices to determine whether the defective memory cells have been replaced by spare cells. Hence, the wafer must be set in off-rack state, but only once. This helps to minimize damages to the pads and to enhance the efficiency of testing the redundancy circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a circuit diagram showing a semiconductor memory according to the present invention;

FIG. 6 is a flow chart explaining how a redundancy circuit according to the invention does operate;

FIG. 7 is a timing chart explaining the operation of the redundancy circuit;

FIG. 8 is another timing chart explaining the operation of the redundancy circuit;

DETAILED DESCRIPTION OF THE PREFERRED EMBODIMENTS

Figure 2:
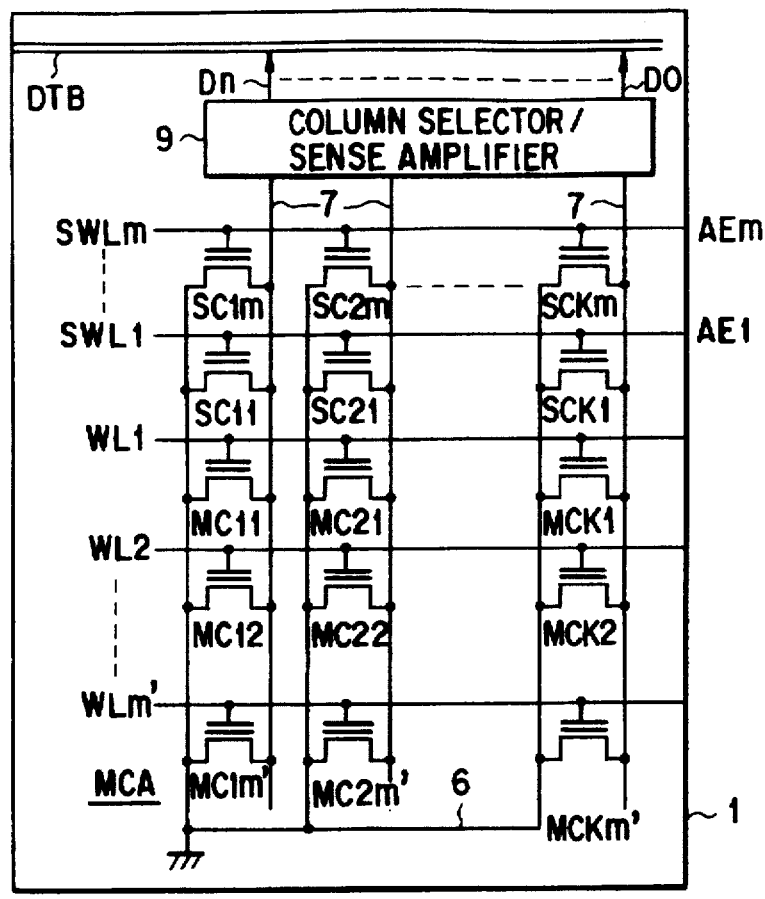
FIG. 2 is a circuit diagram illustrating the memory section of the semiconductor memory shown in FIG. 1.

A semiconductor memory according to the present invention will be described, with reference to the accompanying drawings.

The semiconductor memory has a redundancy circuit. As shown in FIG. 1, the memory comprises a memory section 1, a row decoder 8, level shifters 12, a NOR circuit 13, a spare decoder 20, and multiplexers 25.

The memory section has row lines WL1 to WLm' to which memory cells are connected, and spare row lines SWL1 to SWLm to which spare cells are connected. Address signals A0 to An are supplied to inverters IV1 to IVn through an address bus ADB. The inverters IV1 to IVn invert the address signals A0 to An, and the address signals inverted are supplied to the row decoder 8. The row decoder 8 decodes the address signals, selecting one of the row lines WL1 to WLm'. The outputs of the row decoder 8 by the level shifters 12 to the row lines WL1 to WLm', respectively.

The memory section 1 is connected to the spare decoder 20 by a data bus DTB. The spare decoder 20 has a plurality of registers, which will be described later. The address bus ADB is connected to the spare decoder 20. The data bus DTB extends through the spare decoder 20 and is connected to the memory section 1. Supplied to the spare decoder 20 are a read control signal RDFUSE for reading data from the registers, a write control signal WRFUSE for writing data into the registers, a latch signal RESET for latching data in the registers, and a register-selecting signal RSELECT for selecting desires ones of the registers. The spare decoder 20 is designed to store defective addresses corresponding to defective row lines, to generate coincidence signals AE1 to AEm when the defective addresses are identical to the addresses input, and to test the spare cells before some or all of the fuse elements incorporated in the spare decoder 20 are cut.

The coincidence signals AE1 to AEm output from the spare decoder 20 are supplied to the NOR circuit 13 and multiplexers 25. The multiplexers 25 are provided for selecting the spare row lines SWL1 to SWLm. Supplied to the multiplexers 25 are some of the address signals A0 to An and a test signal TEST2. The NOR circuit 13 generates a spare enable signal $\overline{SE}$ when it receives any one of the coincidence signals AE1 to AEm. The signal $\overline{SE}$ disables the row decoder 8. The multiplexers 25 select the coincidence signals AE1 to AEm when the test signal TEST2 is at low level, and select the address signals A0 to An when the test signal TEST2 is at high level. The test signal TEST2 is at low level while the semiconductor memory remains in operating mode. To replace a defective row line, if any, with one of the spare row lines in accordance with a defective address, one of the multiplexers 25 outputs a signal in accordance with the coincidence signals AE1 to AEm. The signal output from the multiplexer 25 is supplied one of the spare row lines which is connected to the multiplexer 25 by the level shifter 12. Thus, one of the spare row lines SWL1 to SWLm is selected in accordance with the coincidence signals AE1 to AEm.

FIG. 2 shows the memory section 1 in detail. As shown in FIG. 2, the memory section 1 comprises a memory-cell array MCA and a column selector/sense amplifier 9. The memory-cell array MCA includes the row lines WL1 to WLm' and the spare row lines SLM1 to SLMm. The array MCA further comprises memory cells MC11 to MCkm' (e.g., EPROM cells) and spare cells SC11 to SCkm (e.g., EPROM cells). The memory cells MC11 to MCkm' are arranged in m' rows and k columns; k memory cells are connected each row line. The spare cells SC11 to SCkm are arranged in m rows and k columns; k spare cells are connected each spare row line. The source and drain electrodes of each memory cell are connected to the ground line 6 and one column line 7 (bit line), or to the column line 7 and the ground line 6, respectively. The k column lines are connected to the column selector/sense amplifier 9. The column selector/sense amplifier 9 selects one of the memory cells or one of the spare cells in accordance with the address signals supplied it, and amplifies the signal read from the memory cell or spare cell selected. The signal amplified is supplied to the data bus DTB as a data signal D0 to Dn.

Figure 3:
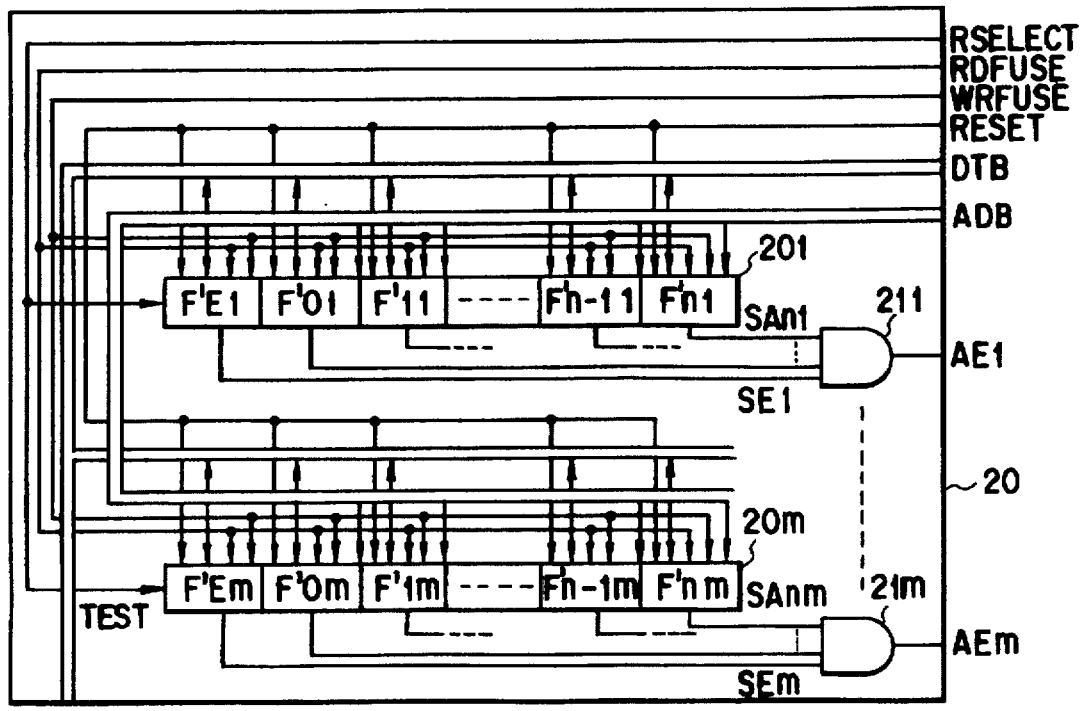
FIG. 3 is a circuit diagram showing the spare decoder incorporated in the semiconductor memory shown in FIG. 1.

FIG. 3 shows the spare decoder 20 in detail. The spare decoder 20 comprises coincidence detecting circuits 201 to 20m and AND circuits 211 to 21m. The signals output from each coincidence detecting circuit are supplied to one AND circuit. The coincidence detecting circuit 201 comprises fuse circuits FE1, F01, F11, ... Fn-11 and Fn1. The coincidence detecting circuit 21m comprises fuse circuits FEm, F0m, F1m, ... Fn-1m, Fnm. Each coincidence detecting circuit are connected to the data bus DTB and the address bus ADB. Supplied to the fuse circuits of each coincidence detecting circuit are the read control signal RDFUSE, write control signal WRFUSE, latch signal RESET and register-selecting signal RSELECT, all described above. The fuse circuits of each coincidence detecting circuit output signals each having logic value "1" when the address signals A0 to An input to them are identical to the defective address signals stored in them. In this case, the AND circuit to which "1s" are input generates a coincidence signal.

The coincidence detecting circuits 201 to 20m are identical in structure. Therefore, only the coincidence detecting circuit 201 will be described with reference to FIG. 4.

In the circuit 201, the fuse circuit FE1 stores a bit which enables the coincidence detecting circuit 201 so that the redundancy circuit can be used. The fuse circuit FE1 comprises a P-channel MOS transistor 40 (hereinafter referred to as "PMOS transistor 40"), a fuse element F, a first register 41, a second register 43, an inverter 42, a tristate buffer circuit 44, and a multiplexer 45. The PMOS transistor 40 and the fuse element F are connected in series between the power supply and the ground. The node NE of the PMOS transistor 40 and the fuse element F is connected to the data-input terminal D of the first register 41 constituted by a D-type flip-flop circuit. The latch signal input terminal ø receives the latch signal RESET. The inverter 42 inverts the latch signal RESET, which is supplied to the gate of the PMOS transistor 40. Upon receiving the latch signal RESET, the first register 41 stores the data which is stored at the fuse element F.

The second register 43 is a D-type flip-flop circuit. The register 43 stores the test address data supplied to its data-input terminal D from an external device. The write control signal WRFUSE is supplied to the latch signal input terminal ø of the second register 43. The Q-output signals of both registers 41 and 43 are supplied to the multiplexer 45, along with the register-selecting signal RSELECT.

The multiplexer 45 comprises two AND circuits and one OR circuit which receives the outputs of the AND circuits. The multiplexer 45 selects the output signal of the first register 41 or that of the second register 43 in accordance with the register-selecting signal RSELECT. The signal selected is outputted as a spare enable signal SE1 from the multiplexer. While the semiconductor memory remains in operating mode, the register-selecting signal RSELECT is at the low level, and the multiplexer 45 selects and outputs the data output from the first register 41. While the semiconductor memory remains in test mode, the register-selecting signal RSELECT remains at the high level, and the multiplexer 45 selects and outputs the data stored in the second register 43.

The output terminal of the multiplexer 45 is connected by the tristate buffer circuit 44 to the data-input terminal D of the second register 43. Supplied to the buffer circuit 44 is the read control signal RDFUSE. This signal RDFUSE controls the tristate buffer circuit 44.

The fuse circuits F01 to Fn1 incorporated in the coincidence detecting circuit 201 store a defective address. These fuse circuits F01 to Fn1 are identical in structure to the fuse circuit FE1, except that they have an exclusive OR circuit 46 each. Their components are therefore designated at the same reference numerals as those of the fuse circuit FE1. In each of the fuse circuits F01 to Fn1, the signal output from the multiplexer 45 is supplied to the exclusive OR circuit 46 along with the corresponding address signal. The exclusive OR circuits 46 of the fuse circuits F01 to Fn1 output signals SA0 to SAn, respectively.

A one-chip microcontroller incorporating a nonvolatile memory according to the invention, which includes a redundancy circuit, will be described with reference to FIG. 5.

Figure 5:
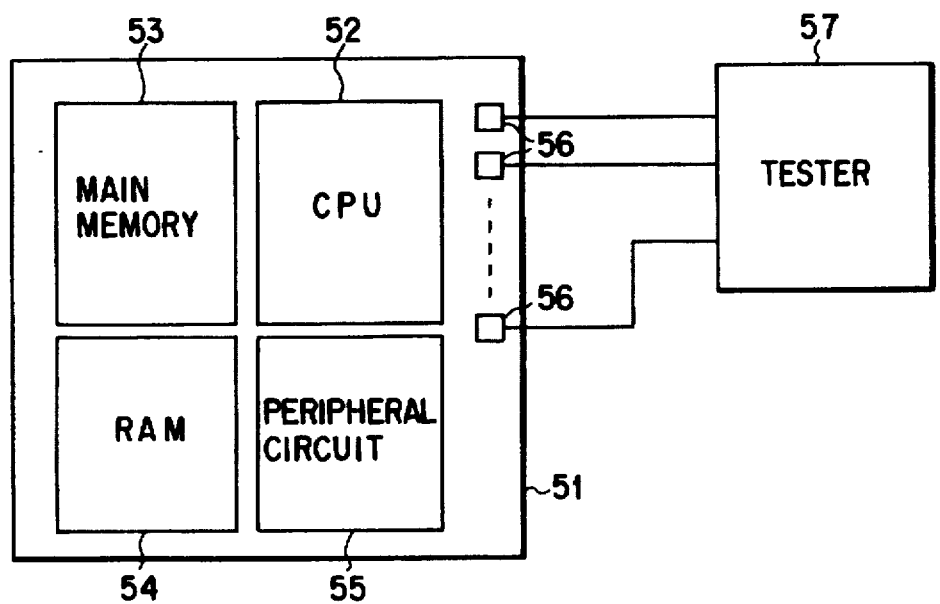
FIG. 5 is a block diagram illustrating a one-chip microcontroller incorporating a nonvolatile memory which includes a redundancy circuit.

As seen from FIG. 5, the one-chip microcontroller comprises a semiconductor substrate 51, a CPU 52, a main memory 53, a RAM 54, a peripheral circuit 55 and pads 56. The main memory 53, RAM 54, peripheral circuit 55 and pads 56 are connected to the CPU 52. The main memory 53 stores various programs, one of which controls the CPU 52. The main memory 53 is a nonvolatile one, or an EPROM which includes the redundancy circuit described above. The peripheral circuit 55 comprises micro-cells, among which are an A/D converter, a timer circuit, a serial/parallel converter. When the one-chip microcontroller is to be tested, the pads 56 are connected to the probe of a tester 57.

The operation of the nonvolatile memory incorporated in the one-chip microcontroller will be described. The one-chip microcontroller can operate in four modes illustrated in FIGS. 10A, 10B, 10C and 10D, which are one-chip mode, writer mode, first test mode and second test mode. A user can use the microcontroller in the one-chip mode and the writer mode and cannot use it in the first or second test mode. Only can the manufacturer use the microcontroller in the two test modes.

How to replace any defective row of memory cells with a spare row of memory cells while the microcontroller is set in the one-chip mode will be explained, with reference to the timing chart of FIG. 7.

In the one-chip mode, the one-chip microcontroller executes instructions, while reading program data stored in the main memory 53. At first, the microcontroller is reset or initialized. Then, it is released from the reset state. It starts reading the program data from the main memory 53 and executes the instructions.

A signal obtained by inverting a reset signal RESET turns on the PMOS transistors 40 in order to read data from the fuse elements F while the microcontroller remains reset. While conducting, each PMOS transistor 40 has a resistance higher than that of the fuse element to which it is connected. Therefore, the potential of the node NE (Nn, n=0 ... n) of the fuse element F and the PMOS transistor 40 is at the low level if the fuse element F has not been cut. If the fuse element F has been cut, the potential of the node NE (Nn) is at the high level. "NE (Nn)" in FIG. 7 indicates the levels the signal at each node NE (Nn) can take. While the microcontroller is in the one-chip mode, the register-selecting signal RSELECT is set at the low level, whereby the multiplexer 45 selects the data stored in the first register 41 in each fuse circuit. Hence, the output signal SE1 (SAn, n=0-n) of the multiplexer 45 is at the high level if the fuse element F has been cut, and at the low level if the fuse element F has not been cut.

In each fuse circuit, the data read from the fuse element F is latched in the first register 41 when the reset signal RESET falls to the low level. At the same time, the PMOS transistor 40 is turned off, stopping the supply of a current to the fuse element F, whereby power is saved.

Thereafter, the CPU 52 starts operating. When the main memory 53 is accessed, each of the coincidence detecting circuits 201 to 20m incorporated in the spare decoder 20 compares the data stored in the first registers 41 with the input address. If the input address is a defective one, at least one of the coincidence signals AE1 to AEm output from the AND circuits 211 to 21m rises to the high level. In this case the spare enable signal $\overline{SE}$ output from the NOR circuit 13 comes to have logic value "0". As a result, access to any row line that includes at least one defective memory cell is prohibited, and one of the spare row lines is selected to replace the defective row line. Data can therefore be read from the spare cells connected to the spare row line selected.

How the one-chip microcontroller operates while set in the writer mode will be explained.

While the microcontroller remain in the the writer mode, the user can write data into the main memory 53 which is an EPROM. In the writer mode, the CPU 52 is reset by the reset signal RESET since it need not be operated to write data into the main memory 53. In each coincidence detecting circuit, the PMOS transistors 40 are turned on by a signal generated by inverting the reset signal RESET, thereby reading data from the fuse elements F. Therefore, in each fuse circuit, the potential of the node NE (Nn, n=0–n) of the fuse element F and the PMOS transistor 40 is at the low level if the fuse element F has not been cut. If the fuse element F has been cut, the potential of the node NE (Nn) is at the high level. As in the one-chip mode, the register-selecting signal RSELECT is set at the low level, whereby the output signals SE1 (SAn, n=0–n) of the fuse circuits have values determines by the fuse data, i.e., the data items stored in the fuse circuit FE1, F01, . . . Fn1 in the case of the first coincidence detecting circuits 201.

Assume an address, i.e., one designating a defective row line, is supplied to the main memory 53 from an external writer (not shown). The address is compared with the data stored in the fuse elements F and read via the first registers 41, as in the case where the CPU 52 is reset while the microcontroller remains in the one-chip mode. If the data is found to be identical to the address supplied from the external writer, a spare row line will be selected to replace the defective row line. If a write signal is supplied to the main memory 53, data is written into the spare cells connected to the spare row line thus selected. If a read signal is supplied to the main memory 53, data is read from the spare cells connected to the spare row line thus selected.

How to test the main memory 52 in the first test mode will be explained.

In the first test mode, data can be read from the main memory 53 (i.e., an EPROM) in the same way as in the writer mode. The first test mode differs from the writer mode in that the register-selecting signal RSELECT is set at the high level, whereby the multiplexer 45 selects the output of the second register 43 in each fuse circuit incorporated in any coincidence detecting circuit. Thus, an defective row line can be replaced with a spare row line on the basis of the test address data stored in the second registers 43, and the main memory 53 can then be tested.

How to test the main memory 52 in the second test mode will be explained.

Figure 10:
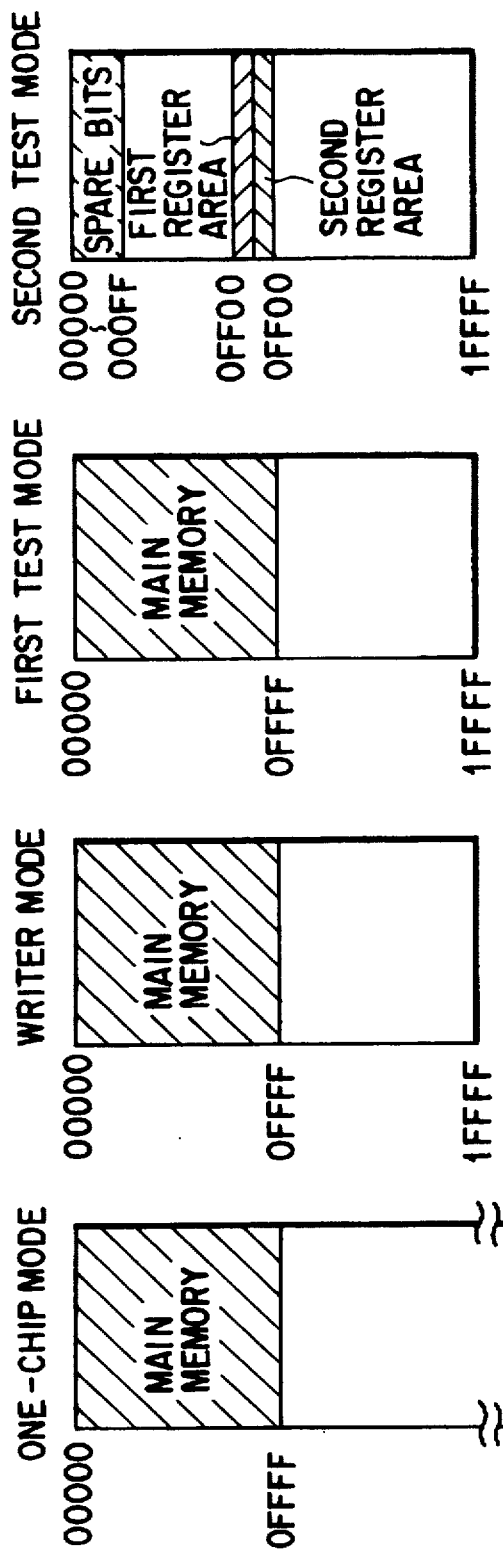
FIGS. 10A to 10D are memory mapping diagrams of a semiconductor memory according to this invention.

In the second test mode, the spare row lines are tested to see whether or not data is correctly written into and read from the spare memory cells connected to the spare row lines. As shown in FIG. 10D, a first register area is allocated to the first registers 41, and a second register area to the second registers 43. Hence, the data (i.e., the fuse data) stored in the first registers 41 can therefore read out, and the test address data (i.e., pseudo-fuse data) for use in the first test mode can be written into and read from the second registers 43. To read data from and write data into the spare cells connected to any spare row line, the address signal designating the spare row line is supplied to the main memory 53 from an external device. In the main memory 53, this address signal is supplied to the multiplexers 25 (FIG. 1). The address is supplied to the spare low line via the NOR circuit 13 since the test signal TEST2 is at the high level in the second test mode. The test signal TEST2 is input to the NOR circuit 13, whereby the output signal $\overline{SE}$ of the NOR circuit 13 falls to the low level. The row decoder 8 is thereby inhibited to receive inputs. As a result, all row lines WL1 to WLm' can no longer be selected. Data can be read from and written into the spare cells in the same manner as in the writer mode.

The data stored into the first registers 41 from the external device is read out through the multiplexers 45 as long as the register-selecting signal RSELECT remains at the low level. The data is supplied to the data bus DTB via the tristate buffers 44 if the buffers 44 have been turned on by the read control signal RDFUSE. The fuse data can therefore be read out in response to the register-selecting signal RSELECT and can be supply to the external device.

Further, test address data (i.e., pseudo address data) is supplied from an external device via the data bus DTB to the data-input terminals D of the second registers 43, and the write control signal WRFUSE is supplied to the latch signal input terminals ø of the second register 43. Data can thereby be written into the second registers 43. In addition, the data can be read from the second registers 43 through the multiplexers 45 and tristate buffers 44 by setting the register-selecting signal RSELECT at the high level.

A method of testing the redundancy circuit incorporated in the one-chip microcontroller will be explained with reference to FIGS. 6, 8 nd 9. In the method, the semiconductor substrate 51 is attached to the tester 57 as shown in FIG. 5, with the pads 56 connected to the probe of the tester 57.

First, ultraviolet rays are applied to the main memory 53, erasing data from all memory cells. The one-chip microcontroller is set in the writer mode. It is determined whether all memory cells are initialized or not (Step ST11). If YES in Step ST11, data is written into all memory cells, and it is determined whether or not the memory cells store the test data correctly (Step ST12). If YES in Step ST12, the memory is found to have no defects, and the redundancy circuit need not be used at all. In this case, the semiconductor substrate 51 is removed from the tester 57 and subjected to high-temperature withstanding test in a test apparatus (Step ST13). Thereafter, the substrate 51 is attached to the tester 57 again. The test data is read from the main memory 53, whereby it is determined whether the semiconductor memory functions well or not (Step ST14). If all bits of the test data remain stored in the memory cells, the semiconductor memory is regarded as flawless. Thus, the test completes for the main memory 53.

If NO in Step ST11, that is, if a part of data is found stored in the memory cells, indicating that at least one memory cell is defective, the flow goes to Step ST15. In step ST15 it is detected how many row lines are defective, the row addresses for the defective row lines are detected, and it is determined whether or not the main memory 53 can be saved by using the limited number of spare row lines. If YES in Step ST15, the flow returns to Step ST12, in which it is again determined whether or not the memory cells store the test data correctly. If NO in Step ST12, the flow goes to Step ST16. In Step ST16, it is determined whether or not the main memory 53 can be saved, in the same way as in Step ST15. If YES in Step ST16, the flow returns to Step S17. In Step ST17, the one-chip microcomputer is set in the second test mode, whereby data is erased from the spare cells and test data is written into the space cells. Step ST17 will be explained in detail.

In the second test mode, the test signal TEST2 is set at the high level. Data is thereby read from the spare cells during the period T1 (FIG. 8), and it is determined whether the data is erased from the spare cells. Then, the address signals for the addresses 00000 to 000FF are sequentially supplied via the address bus ADB (FIG. 1), as is understood from the memory map of the second test mode, illustrated in FIG. 10D. The address signals are further supplied through the multiplexers 25 and the level shifters 12, whereby the spare row lines SWL1 to SWLm are selected. As a result, data are read from the spare cells. It is determined whether or not the data has been correctly erased from the spare cells. If YES, the data to be written into the memory cells of any row line that has been found defective in Step ST15 or ST16 is written during the period T2 (FIG. 8) into the spare cells of the spare row line which corresponds to the defective row line. If this data is correctly written into the spare cells, spare enable data and a defective address are stored into the second registers 43 included in the respective fuse circuits of the coincidence detecting circuit provided for the spare row line. In the case of the coincidence detecting circuit 201, the spare enable data and the defective address are stored into the second registers 43 of the fuse circuits FE1, F01, . . . Fn1. This is achieved by setting the register-selecting signal RSELECT and the write control signal WRFUSE at the high level, thereby supplying the spare enable data and the defective address to the second registers 43 through the data bus DTB. Then, the write control signal WRFUSE is set at the low level, whereby the spare enable data and the defective address are latched in the second registers 43. In the case shown in FIG. 10D, the spare enable data and the defective address are latched in the second registers 43 incorporated in the fuse circuits F01 to Fn1 when the address 0 FF00 is designated.

Figure 4:
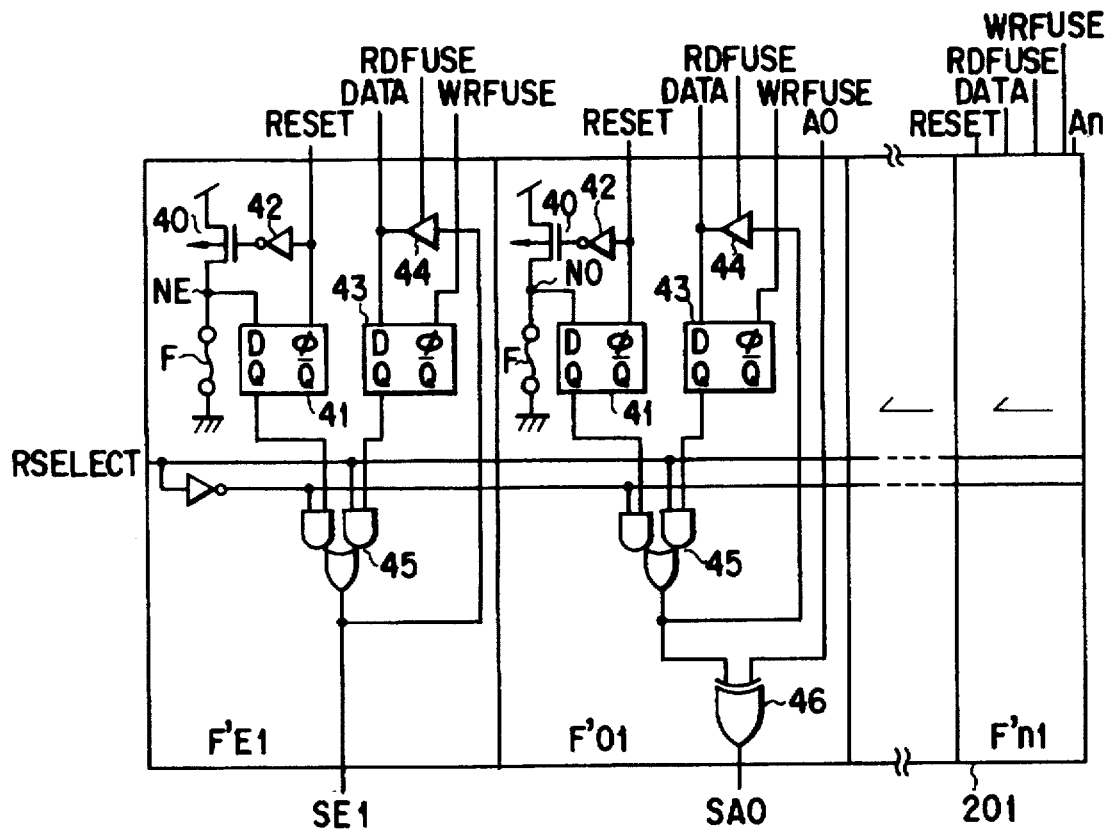
FIG. 4 is a circuit diagram illustrating the coincidence detecting circuit incorporated in spare decoder shown in FIG. 3.

The read control signal RDFUSE is set at the high level to determine whether or not spare enable data and the defective address have been latched in the second registers 43. Then, these data items are read from the second registers 43 to the data bus DTB through the tristate buffers 44 and multiplexers 45 which are shown in FIG. 4.

Figure 9:
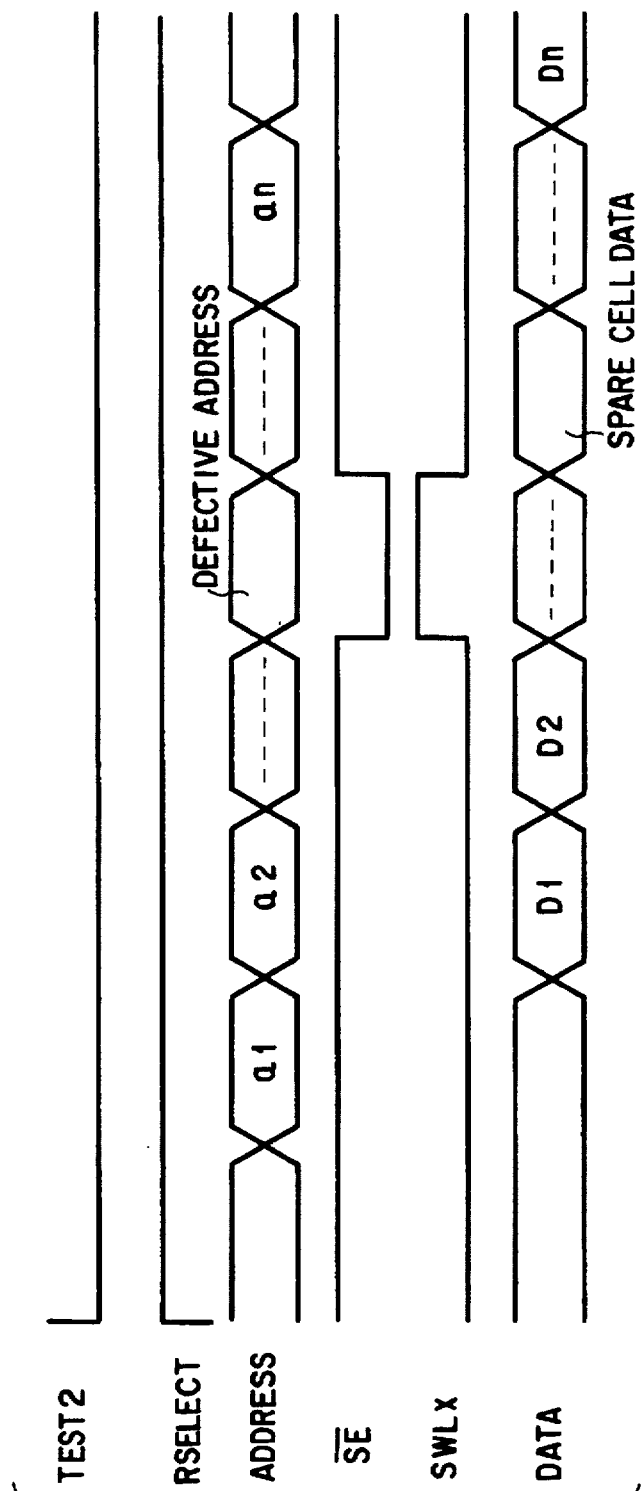
FIG. 9 is still another timing chart explaining the operation of the redundancy circuit.

Thereafter, the one-chip microcontroller is set in the first test mode. In Step ST18, the defective row line is replaced by the corresponding spare row line in accordance with the defective address stored in the second registers 43, and it is determined whether or not test data has been erased from all memory cells. FIG. 9 is a timing chart of the first test mode.

In Step ST18, the test signal TEST2 is set at the low level, thereby setting the one-chip microcontroller in the first test mode. Addresses are then supplied via the address bus DTB, one after another. The memory cells are thereby accessed sequentially, whereby data is read from the memory cells. When a defective address is supplied through the address bus DTB, the defective memory cells are replaced by the spare cells in accordance with the defective address latched in the second registers 43 in Step ST17. Data is thereby read from the spare cells. Thus, it is determined whether or not the data has been correctly written into the main memory 53. To achieve this, the register-selecting signal RSELECT is set at the high level so that the data latched in the second registers 43 may be output through the multiplexers 45.

Then, the main memory 53 operates in the same way as in the writer mode. More precisely, addresses are sequentially supplied externally. If an address is found identical to the defective address stored in the second registers 43, one of the coincidence signals AE1 to AEm output from the spare decoder 20 rises to the high level. The output signal SE of the NOR circuit 13 therefore falls to the low level. All row lines WL1 to WLm' are thereby rendered not selected. Hence, the spare row lines SWL1 to SWLm are accessed, whereby data is read from the spare cells.

If the defective row line has been replaced by the spare row line and data has been correctly erased from all memory cells in Step ST18, indicating that the main memory 53 is saved, the flow goes to Step ST19. In Step ST19, some of the fuse elements incorporated in the spare decoder 20 are cut in accordance with the defective address and spare enable data which have been detected in Steps ST15 and ST16. Thereafter, the semiconductor substrate 51 is removed again from the tester 57 and subjected to high-temperature withstanding test in a test apparatus (Step ST13). Further, the substrate 51 is attached to the tester 57 again, and data is read from the memory, to determine whether the semiconductor memory functions well or not (Step ST14). If YES in Step ST14, the main memory 53 is found flawless. If NO, it is regarded as defective.

Figure 11:
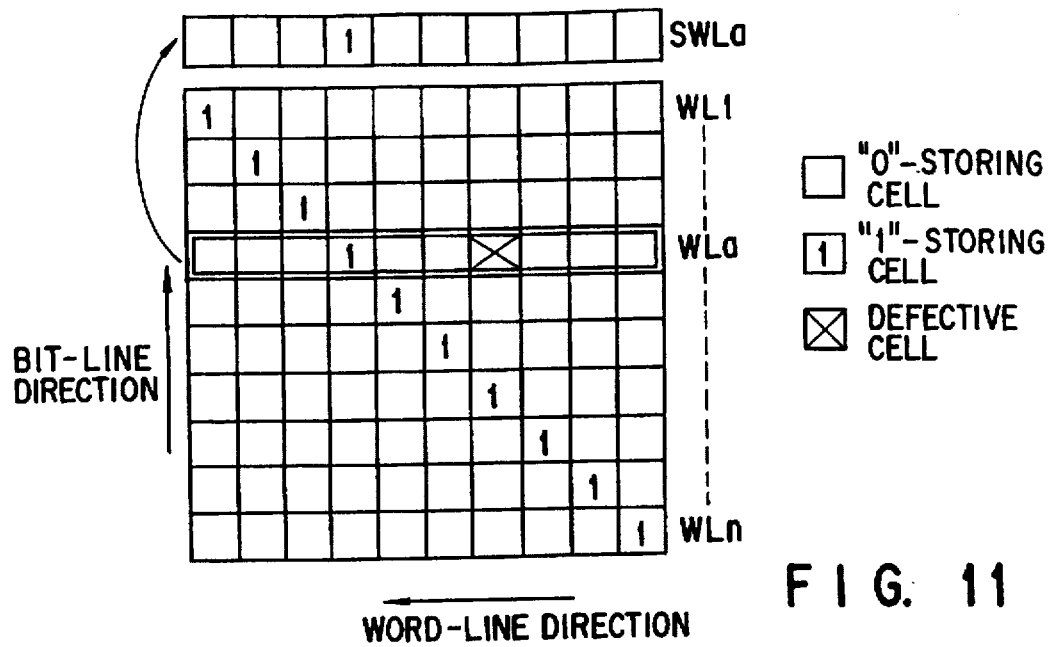
FIG. 11 is a pattern used to test the semiconductor memory of this invention.
Figure 12:
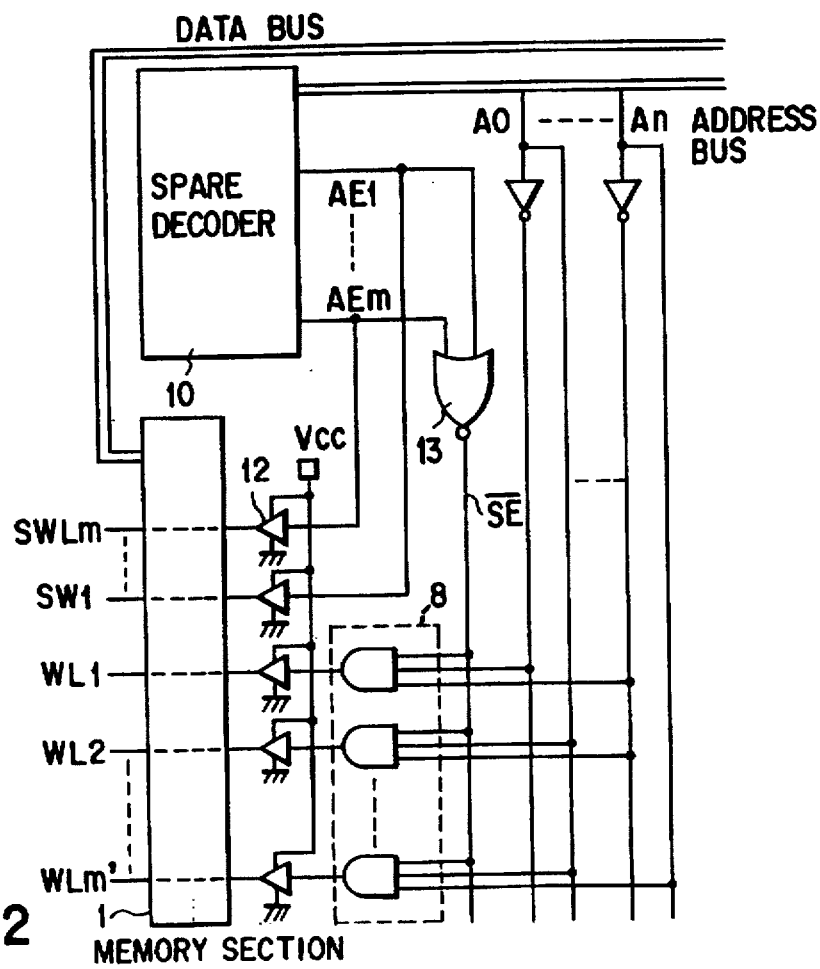
FIG. 12 is a circuit diagram showing a conventional semiconductor memory.
Figure 13:
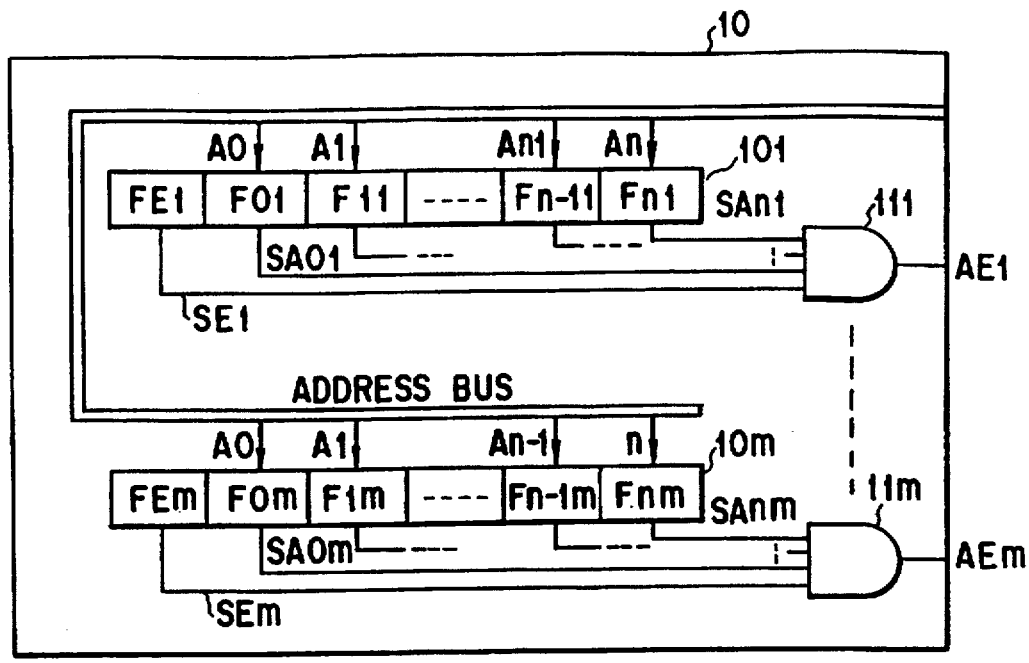
FIG. 13 is a circuit diagram illustrating the spare decoder incorporated in the conventional semiconductor memory.
Figure 14:
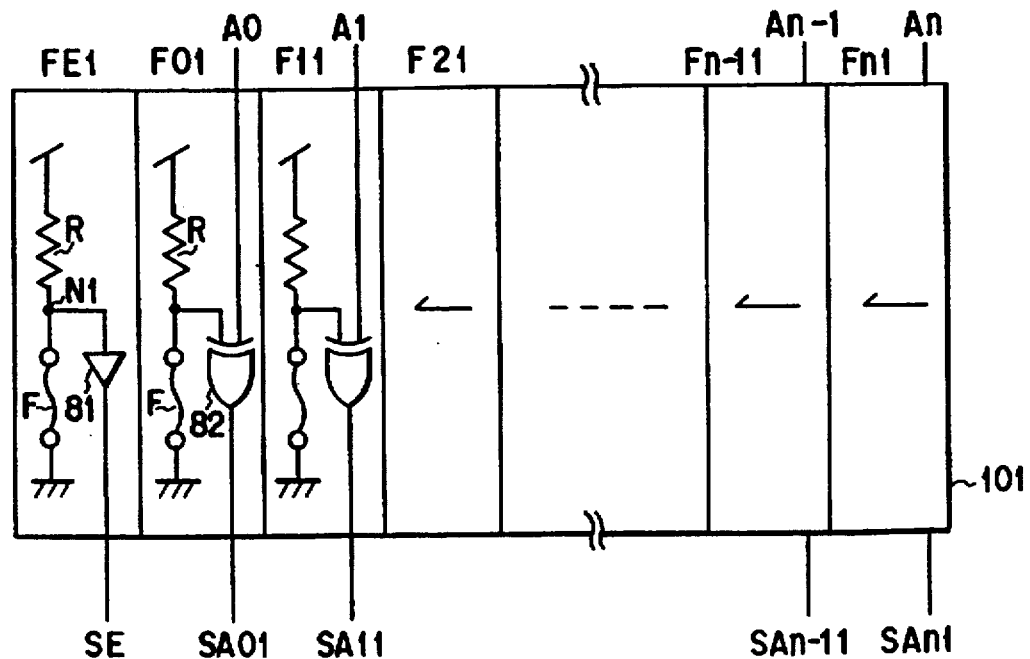
FIG. 14 is a circuit diagram of the coincidence detecting circuit incorporated in the conventional semiconductor memory.
Figure 15:
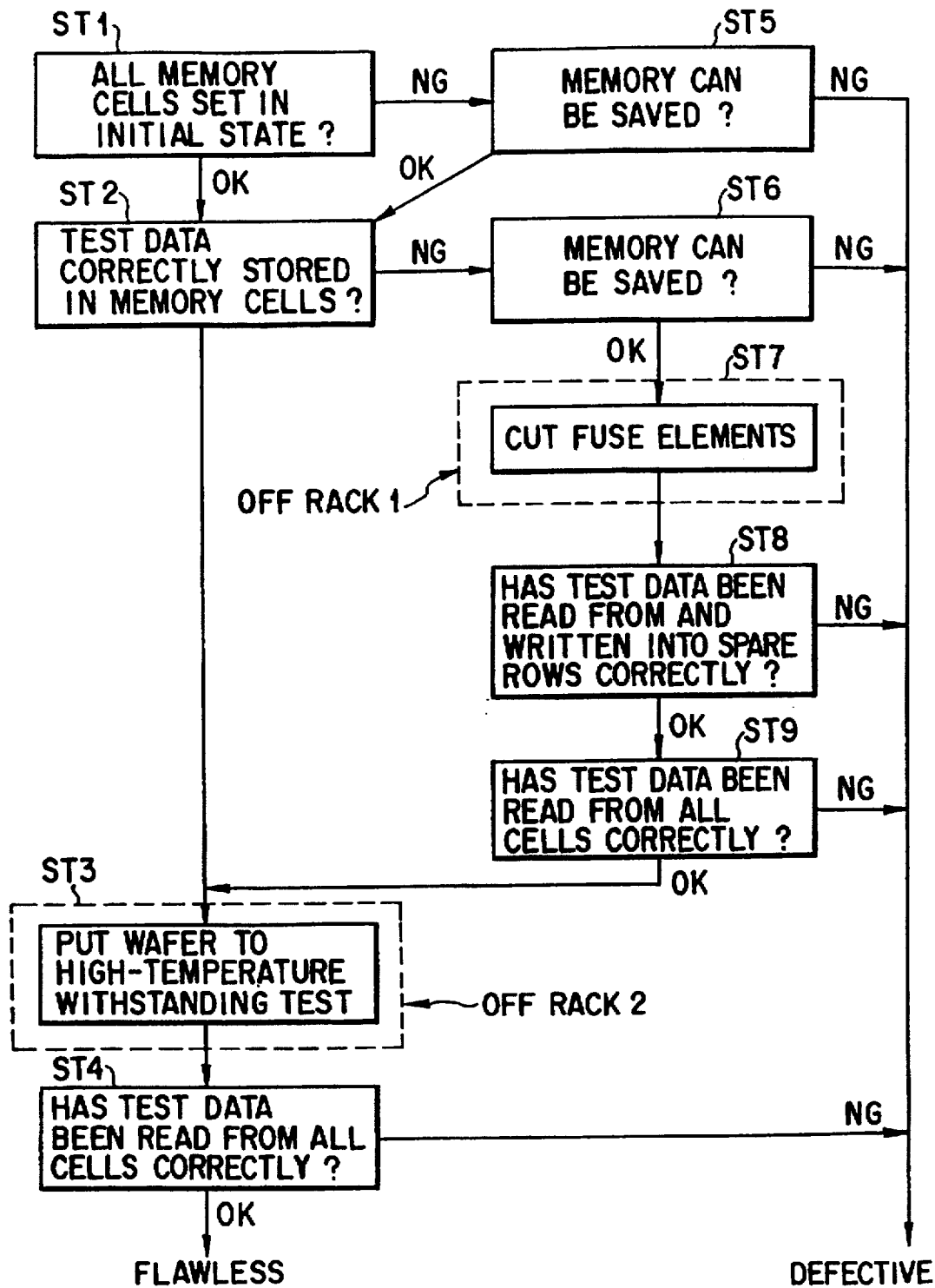
FIG. 15 is a flow chart explaining how the conventional memory is tested.

The data written into the spare cells in Step ST17 can be identical to the data which is written into the memory cells connected to the defective row line which should be replaced by the spare row line. For example, data representing the diagonal pattern shown in FIG. 11 may be written in Step ST12, into the memory cells connected to the row lines. If the row line WLa, for example, is found to have at least one defective memory cell, the pattern stored in the cells connected to the row line WLa is written into the spare cells connected to the spare row line SWLa. Therefore, the pattern of the data to be compared with the data which has been read from the memory cells and which is to be used in Step ST14 can be the same as the pattern of the data which is to be used in Step ST18. This helps to raise the efficiency of testing the redundancy circuit and to reduce the storage capacity for storing the patterns.

If it is found in Step ST16 that the main memory 53 can be saved, test address data is input to the spare row lines SWL1 to SWLm before some of the use elements F are cut. The spare cells are thereby checked to see whether they are initialized or not and whether they can store data correctly. Furthermore, a defective row line, if any, can be replaced by the corresponding spare row line, without cutting the fuse elements F, because the test address data (i.e., pseudo address data) is stored into the second registers 43. Thus, it is possible to determine whether or not data can be correctly read from all selected memory and spare cells. Since the spare row lines and the spare cells can be checked for their function, before some of the fuse elements are cut, it is possible not only to shorten the time of testing the redundancy circuit, but also to lower the possibility that the spare row lines are found to be defective after some of the fuse elements are cut.

After some of the fuse elements F have been cut, the semiconductor substrate 51 is removed again from the tester 57 and subjected to high-temperature withstanding test, and is attached to the tester 57 again so that data may be read from the memory to determine whether the semiconductor memory functions well or not. Hence, the substrate 51 needs to be removed from the tester 57 only once, as in the case where no spare row lines need to replace the row lines in order to save the main memory 53 because all row lines are flawless. This minimizes damages to the pads 56 and shortens the time of testing the redundancy circuit to increase the efficiency of the test.

As described above, the fuse elements F are of the type which is melted and cut by supplying a current through it or applying a laser beam to it. Instead, the elements F may be of any other type.

What is claimed is:

1. A semiconductor memory device comprising:

a memory section having a plurality of row lines, a plurality of spare row lines, a plurality of memory cells arranged in rows and connected to the row lines, and a plurality of spare cells arranged in rows and connected to the spare row lines;

a nonvolatile memory storing at least one defective address representing a row line including at least one defective memory cell, and storing data for allowing at least one spare row line to replace said at least one row line;

a first register connected to store the data read from said nonvolatile memory;

a second register connected to store defective addresses supplied from an external device and representing defective ones of said row lines and storing the data read from said nonvolatile memory; and a selecting circuit connected to select one of signals output from said first and second registers, in accordance with a selection signal;

wherein, in a first mode, other than a test mode, any row line including at least one defective memory cell is replaced by one of said spare row lines in accordance with the data stored in said first register, and in a second mode, which is a test mode, any row line including at least one defective memory cell is replaced by one of said spare row lines in accordance with the data stored in said second register.

2. The device according to claim 1, further comprising selection means for selecting said one of said spare row lines in accordance with an address, in the test mode.

3. The device according to claim 1, wherein said nonvolatile memory means comprises fuse elements which are cut when a current is supplied or a laser beam is applied to said fuse elements.

4. The device according to claim 1, further comprising a control circuit for reading data from said nonvolatile memory means during a reset period, storing data into said first register in response to a reset-release signal, and replacing any row line including at least one defective memory cell with one of said spare row lines in accordance with the data stored in said first register.

5. A semiconductor memory device comprising:

a memory section having a plurality of row lines, a plurality of spare row lines, a plurality of memory cells arranged in rows and connected to the row lines, and a plurality of spare cells arranged in rows and connected to the spare row lines;

a first decoder connected to said row lines, for selecting one of said row lines in accordance with address data;

a second decoder connected to said spare row lines, an address bus, and a data bus, for generating a selection signal to select one of said spare row lines, in response to a defective address supplied through said address bus and representing a defective memory cell;

a selection circuit connected to select one of said spare row lines in accordance with address data while said semiconductor memory device is set in test mode;

a prohibition circuit connected to prohibit said first decoder from selecting one of said row lines while said second decoder and said selection circuit are cooperating to select one of said spare row lines; and said second decoder has a logic circuit which stores the defective address supplied from an external device in the test mode and representing the defective memory cell and which outputs said selection signal when the defective address stored in the logic circuit is identical to a defective address supplied from the external device.

6. A semiconductor memory device comprising:

a memory section having a plurality of row lines, a plurality of spare row lines, a plurality of memory cells arranged in rows and connected to the row lines, and a plurality of spare cells arranged in rows and connected to the spare row lines;

a first decoder connected to said row lines, for selecting one of said row lines in accordance with address data;

a second decoder connected to said spare row lines, an address bus, and a data bus, for generating a selection signal to select one of said spare row lines, in response to a defective address supplied through said address bus and representing a defective memory cell, said second decoder having a nonvolatile memory for storing at least one defective address representing one row line including at least one defective memory cell, and storing data for allowing at least one spare row line to replace said at least one row line, a first register connected to store the data read from said nonvolatile memory, a second register connected to said address data bus and said data bus, for storing defective addresses supplied from an external device and representing defective ones of said row lines and for storing the data read from said nonvolatile memory, and a first selecting circuit connected to select one of signals output from said first and second registers, in accordance with the selection signal;

a second selection circuit connected to select one of said spare row lines in accordance with address data while said semiconductor memory device is set in test mode;

a prohibition circuit connected to prohibit said first decoder from selecting one of said row lines while said second decoder and said first selection circuit are cooperating to select one of said spare row lines; and said second decoder has a logic circuit which stores the defective address supplied from an external device in the test mode and representing the defective memory cell and which outputs said selection signal when the defective address stored in the logic circuit is identical to a defective address supplied from the external device.

7. The device according to claim 6, further comprising an exclusive OR logic circuit for comparing the signal output from said selection circuit with an address data supplied from the external device and for outputting a signal when the signal coincides with the address data.

8. The device according to claim 6, wherein said nonvolatile memory comprises fuse elements which are cut when a current is supplied or a laser beam is applied to said fuse elements.

9. The device according to claim 8, further comprising transistors each of which has a current path connected between a power supply and one fuse element and a gate connected to receive a signal to be supplied to said first register, and which are turned off when said first register stores the data of said fuse elements.

10. The device according to claim 7, further comprising a gate circuit connected between an output terminal of said selection circuit and said data bus, for transferring to said data bus a signal output from said selection signal, in response to a read control signal.

11. A semiconductor memory device comprising:

a memory section having a plurality of row lines, a plurality of spare row lines, a plurality of memory cells arranged in rows and connected to the row lines, and a plurality of spare cells arranged in rows and connected to the spare row lines;

a first decoder connected to said row lines, for selecting one of said row lines in accordance with address data;

a second decoder connected to said spare row lines, an address bus, and a data bus, for generating a selection signal to select one of said spare row lines, in response to a defective address supplied through said address bus and representing a defective memory cell;

a selection circuit connected to select one of said spare row lines in accordance with address data while said semiconductor memory device is in a test mode;

a prohibition circuit connected to prohibit said first decoder from selecting one of said row lines while said second decoder and said selection circuit are cooperating to select one of said spare row lines;

said second decoder has a logic circuit which stores the defective address supplied from an external device in the test mode and representing the defective memory cell and which outputs said selection signal when the defective address stored in the logic circuit is identical to a defective address supplied from the external device;

a semiconductor substrate on which said memory section, said first decoder, said second decoder and said selection section circuit are provided;

a processor provided on said semiconductor substrate, for processing data read from said memory section; and a plurality of pads provided on said semiconductor substrate, connected to said processor and located to contact the probe of a tester in the test mode.

12. The device according to claim 11, wherein said tester reads data from all memory cells in the test mode, thereby determining whether all memory cells are initialized, determines whether it is possible to write data into all memory cells, when all memory cells are found to be initialized, reads data from all spare cells, thereby determining whether all spare cells are initialized, when at least one of said memory cell is found defective, determines whether it is possible to write data into said spare cells, causes said second register to store the address data of the at least one defective memory cell, when all spare cells are found flawless, and replaces said at least one defective memory cell with one of said spare cells in accordance with the address data stored in said second register.

13. A method of testing a semiconductor memory device, comprising:

a first step of reading data from all memory cells, thereby to determine whether the memory cells are initialized;

a second step of determining whether it is possible to write data into all memory cells, when all memory cells are found initialized;

a third step of reading data from spare cells when at least one defective memory cell is detected in said first step or said second step, determining whether the spare cells are initialized, determining whether it is possible to write data into the spare cells, and storing into a register an address data for said at least one defective memory cell and data allowing at least one spare row line to replace said at least one row line, when it is found possible to write data into the spare cells;

a fourth step of replacing said at least one defective memory cell with one of the spare cells in accordance with the address data stored in said register, and determining whether it is possible to read data from all memory cells; and a fifth step of cutting fuse elements incorporated in a redundancy circuit in accordance with the address data for said at least one defective memory cell, when it is determined in said fourth step that it is possible to replace said at least one defective memory cell with one of the spare cells so as to read data from all memory cells.

14. The method according to claim 13, wherein the data written into said spare cells in said third step is identical to the data written into all memory cells in said second step.

* * * * *